United States Patent
Sivadasan et al.

(10) Patent No.: US 10,254,812 B1
(45) Date of Patent: Apr. 9, 2019

(54) LOW INRUSH CIRCUIT FOR POWER UP AND DEEP POWER DOWN EXIT

(71) Applicant: Cypress Semiconductor Corporation, San Jose, CA (US)

(72) Inventors: Mohandas Sivadasan, Colorado Springs, CO (US); Jayant Ashokkumar, Colorado Springs, CO (US); Iulian Gradinariu, Colorado Springs, CO (US); Abhisek Dey, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/938,840

(22) Filed: Mar. 28, 2018

Related U.S. Application Data (60) Provisional application No. 62/598,312, filed on Dec. 13, 2017.

(51) Int. Cl.
*G06F 1/3203* (2019.01)
*G11C 5/14* (2006.01)
*H03K 19/177* (2006.01)

(52) U.S. Cl.
CPC ............ *G06F 1/3203* (2013.01); *G11C 5/148* (2013.01); *H03K 19/17772* (2013.01)

(58) Field of Classification Search
CPC combination set(s) only.
See application file for complete search history.

(56) References Cited

U.S. PATENT DOCUMENTS

| | | | |
|---|---|---|---|
| 6,469,480 B2 * | 10/2002 | Kanakubo | G05F 1/565 323/269 |
| 6,862,201 B2 | 3/2005 | Hodge | |
| 6,865,063 B2 | 3/2005 | Ball | |
| 8,080,982 B2 * | 12/2011 | Lin | G05F 1/56 323/265 |
| 8,159,199 B2 * | 4/2012 | Arnold | G05F 1/56 323/269 |
| 8,319,545 B2 | 11/2012 | Sousa et al. | |
| 8,558,530 B2 * | 10/2013 | Pulijala | G05F 1/56 323/314 |

(Continued)

OTHER PUBLICATIONS

Alek Kaknevicius, "Managing Inrush Current", Texas Instruments Application Report, May 2015, 13 pgs.

(Continued)

*Primary Examiner* — Jeffery S Zweizig (57) ABSTRACT

Systems, methods, and devices for providing power to low energy circuits include inrush circuits. Devices include a regulator that includes at least one driver device configured to generate a first current associated with a load comprising a low energy integrated circuit. Devices also include a bias generator configured to generate a second current to charge a load capacitor coupled with a power terminal of the low energy integrated circuit. Devices further include an enable circuit configured to enable the bias generator and disable the regulator responsive to a load voltage being below a threshold voltage, and further configured to enable the regulator to generate the first current and disable the bias generator responsive to the load voltage being above the threshold voltage.

19 Claims, 5 Drawing Sheets

(56) References Cited

U.S. PATENT DOCUMENTS

| | | | |
|---|---|---|---|
| 8,988,054 B2* | 3/2015 | Marty | H02M 3/158 |
| | | | 323/273 |
| 9,065,266 B2 | 6/2015 | Divan | |
| 9,071,048 B2 | 6/2015 | Divan | |
| 9,098,101 B2 | 8/2015 | Naidu et al. | |
| 9,136,698 B2 | 9/2015 | Sharma et al. | |
| 9,201,435 B2* | 12/2015 | Hammerschmidt | G05F 1/10 |
| 9,263,098 B2* | 2/2016 | Yoo | G11C 5/147 |
| 9,442,502 B2* | 9/2016 | Chen | H02M 1/36 |
| 9,454,164 B2 | 9/2016 | Bhattad | |
| 9,740,221 B2 | 8/2017 | Cavallini et al. | |
| 9,891,643 B2* | 2/2018 | El-Nozahi | G05F 1/56 |
| 2006/0145673 A1 | 7/2006 | Fogg et al. | |
| 2006/0152954 A1 | 7/2006 | Jovanovic et al. | |

OTHER PUBLICATIONS

Khondker Zakir Ahmed, "Design of a Linearly Increasing Inrush Current Limit Circuit for DC-DC Boost Regulators," IEEE Islamic University of Technology, 2010, p. 863-866.

International Search Report for International Application No. PCT/US18/63571 dated Jan. 16, 2019; 2 pages.

Written Opinion for International Application No. PCT/US18/83571 dated Jan. 16, 2019; 4 pages.

* cited by examiner

LOW INRUSH CIRCUIT FOR POWER UP AND DEEP POWER DOWN EXIT

CROSS-REFERENCE TO RELATED APPLICATIONS

This application claims the benefit under 35 U.S.C. § 119(e) of US Provisional Patent Application No. 62/598,312, filed on Dec. 13, 2017, which is incorporated by reference herein in its entirety for all purposes.

TECHNICAL HELD

This disclosure generally relates to low energy integrated circuits and, more specifically, to power modes associated with such low energy integrated circuits.

BACKGROUND

Electrical systems and devices may include one or more components that may toggle or switch between one or more states or operational modes. For example, an electronic device may switch from an inactive state to an active state, or more specifically, from a hibernate state to an active state. When such switches occur, the electronic device may generate an input surge current that results from the powering on of one or more components of the electronic device. Such currents, that may be inrush currents, may be relatively large and may be larger than a normal load current. Accordingly, electronic devices with limited power supplies, such as batteries, remain limited in their ability to handle such inrush currents associated with mode transitions because such currents can be large, and can generate large draws on a battery.

DETAILED DESCRIPTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific examples, it will be understood that these examples are not intended to be limiting.

Some memory devices may have large inrush currents that result in over-draw of power supplies, such as batteries, and can also result in operational irregularities. More specifically, such large inrush currents, which may be currents drawn from system resources such as VDDD or other voltage supply, may result in the rapid depletion of such batteries, and may also prevent the utilization of low energy components. Moreover, in the context of a hearing aid, large inrush currents during a transition to an active mode may result in the generation of unwanted tones and noises from the hearing aid. Furthermore, some memory devices may implement PMOS devices as drivers in series to generate currents. However, such series configurations require large device geometries not suitable for small layout areas.

Various embodiments disclosed herein provide an inrush circuit configured to control an inrush current provided to one or more devices during transitions between operational modes. For example, such an inrush circuit may control an inrush current provided to a memory device during a transition from a deep sleep or deep power down mode to an active mode. As will be discussed in greater detail below, such control over the inrush current provided to the device enables efficient battery usage, and also facilitates the usage of low energy system components. Furthermore, embodiments disclosed herein are configured to generate such inrush currents with consistency to provide consistent and efficient operation of such low energy devices.

Figure 1:
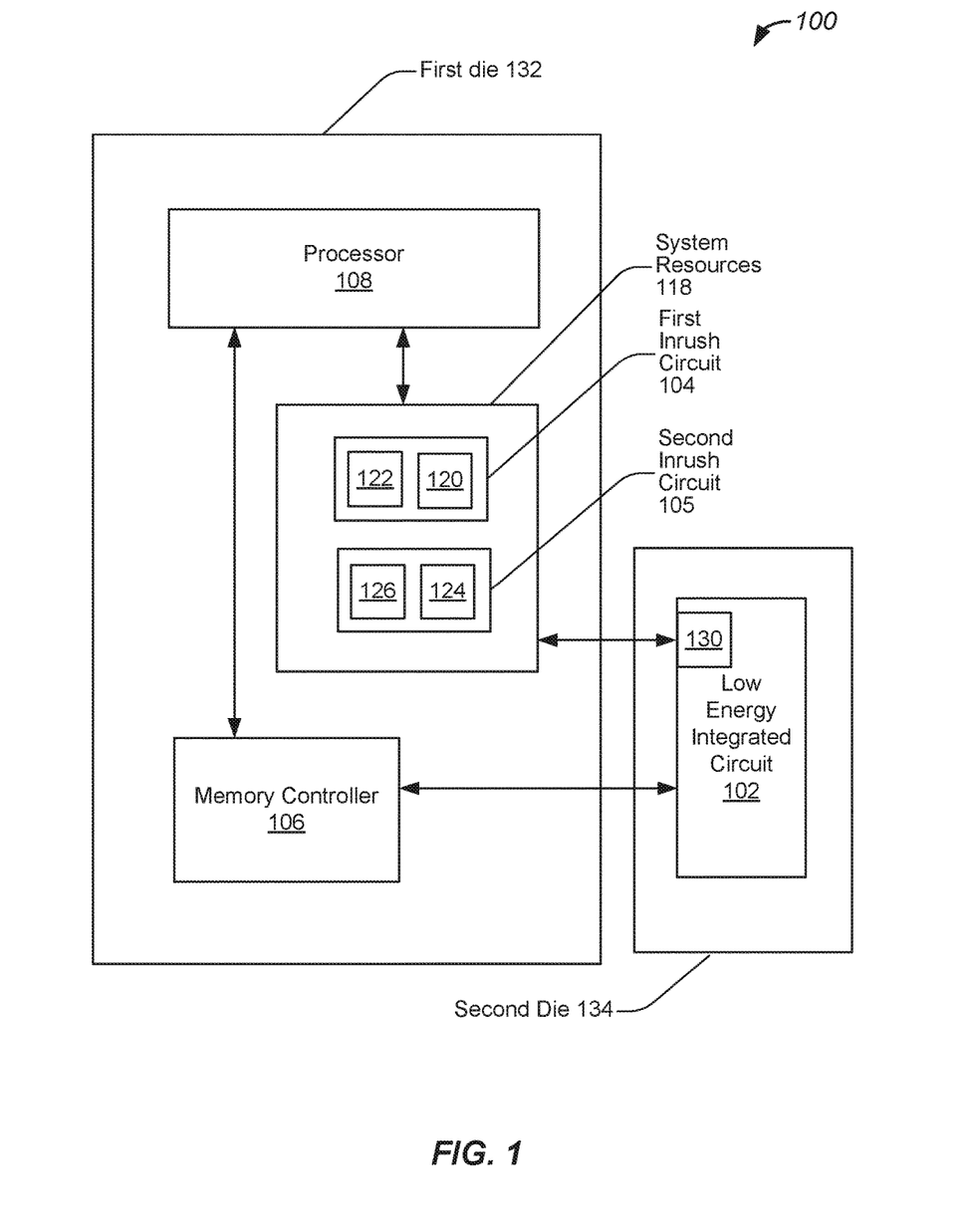
FIG. 1 illustrates an example of a system that includes a low energy memory device and an inrush circuit, configured in accordance with some embodiments.

FIG. 1 illustrates an example of a system that includes a low energy integrated circuit and an inrush circuit, configured in accordance with some embodiments. As discussed above, a system, such as system 100 may include various components capable of providing computational and processing capabilities for various devices that may have low energy operational parameters, such as hearing aids that operate off of batteries. As will be discussed in greater detail below, components of system 100 are configured to provide a low inrush current to system components to preserve battery life and increase the efficiency of the operation of the device itself. Furthermore, components of system 100 may be implemented on one or more dies. For example, system 100 may be implemented utilizing first die 132 as a base controller die, and second die 134 as a tile die. In some embodiments, all components of system 100 may be implemented on a single die.

In various embodiments, system 100 includes low energy integrated circuit 102. As discussed above, low energy integrated circuit 102, may be a memory device, such as a low energy memory device suitable for applications with low energy operational parameters, such as power supply voltages and operational currents. In some embodiments, low energy integrated circuit 102 is an ultra low energy ferro electric random-access memory (FRAM) device. Accordingly, low energy integrated circuit 102 may be configured to have low power usage characteristics. Moreover, low energy integrated circuit 102 is configured to receive power via a VCCD terminal, such as terminal 130. In some embodiments, terminal 130 is a VCCDFRAM terminal when low energy integrated circuit 102 is configured as a low energy FRAM device. In various embodiments, low energy integrated circuit 102 has various different operational modes that correspond to operational modes or states of system 100. For example, low energy integrated circuit 102 may have a hibernate mode, a deep power down mode, a deep sleep mode, and an active mode.

In various embodiments, a hibernate state or mode is when all regulators in the system are turned off, and the components of system 100 are substantially unpowered and inactive. A deep power down state or mode is when a low power logic device, which may be implemented as retention logic, and an associated regulator are powered and operational, but all other components of system 100 are substantially unpowered and inactive. A deep sleep state or mode is when components of system 100 are powered, but components such as low energy integrated circuit 102 are inactive and not implementing read and write access operations. An active state or mode is when all components are powered, and components such as low energy integrated circuit 102 are able to implement various operations, such as read/write and access operations, associated with low energy integrated circuit 102.

As will be discussed in greater detail below, low energy integrated circuit 102 may transition between states or modes responsive to one or more parameters or inputs. For example, low energy integrated circuit 102 may transition from a low energy mode to a high energy mode. Examples of such transitions may include a transition from a hibernate mode to an active mode, a transition from a deep power down mode to an active mode, and a transition from a deep sleep mode to an active mode. In various embodiments, a transition from a low energy mode to a high energy mode, such as a transition from a deep power down mode to an active mode may be implemented in response to a user providing an input to system 100 that may be received by processor 108 discussed in greater detail below.

In various embodiments, system 100 further includes system resources 118, which includes circuitry configured to provide one or more system resources, such as system signals, provided to various components of system 100. As will be discussed in greater detail below, in some embodiments, system resources 118 includes circuitry configured to generate currents, and also generate operational currents and voltages, such as VDDD and VSSD, that are provided to and utilized by components of system 100, such as currents and voltages provided to inrush circuits and low energy integrated circuit 102.

Accordingly, in some embodiments, system resources 118 includes first inrush circuit 104 that is configured to generate a current used, at least in part, to power low energy integrated circuit 102. Accordingly, first inrush circuit 104 is configured to generate and provide an inrush current provided to low energy integrated circuit 102 during transitions between operational modes, and is configured to provide such inrush currents in accordance with one or more operational parameters, such as an amount of current, as well as an amount of time to implement a transition. For example, first inrush circuit 104 may be configured to generate and provide an inrush current to low energy integrated circuit 102 that is less than a designated amplitude to reduce battery draw, while providing enough current to low energy integrated circuit 102 to begin operation within a designated amount of time. As will be discussed in greater detail below with reference to FIG. 2, first inrush circuit 104 may include a regulator, a bias generator, and an enable circuit that are configured to generate the appropriate inrush current for low energy integrated circuit 102. Moreover, first inrush circuit 104 is further configured to operate as a power supply for second die 134 during active operation of components implemented on second die 134. For example, first regulator 120 and first bias generator 122 are configured to provide power for second die 134, as will be discussed in greater detail below with reference to FIG. 2.

System 100 further includes second inrush circuit 105 which is configured to generate inrush currents and power supply signals for first die 132. Accordingly, second inrush circuit 105 includes second regulator 124 and second bias generator 126 which are configured to generate inrush currents and operational power supply signals for components of first die 132, as will be discussed in greater detail below with reference to FIG. 2. It will be appreciated that components of first inrush circuit 104 and second inrush circuit 105 may be configured for particular usage characteristics of their respective downstream components. For example, first inrush circuit 104 may be configured to have different values of load capacitors and design parameters of driver devices than second inrush circuit 105. In one example, first inrush circuit 104 has a larger value of a load capacitor than second inrush circuit 105.

System 100 also includes memory controller 106 which may be coupled with low energy integrated circuit 102 and may also have one or more communications interfaces providing communicative coupling to other system components. In various embodiments, memory controller 106 is configured to manage read and write operations associated with memory devices within system 100, such as low energy integrated circuit 102. Accordingly, memory controller 106 may be communicatively coupled to low energy integrated circuit 102, and may also be coupled with one or more other components, such as processor 108 discussed in greater detail below.

System 100 also includes processor 108 that may be a central processing unit (CPU) that is configured to implement one or more computational operations, and may implement, at least in part, read and write operations associated with memory devices. In various embodiments, processor 108 is further configured to generate input signals provided to low energy integrated circuit 102, such as those associated with transitions between operational modes, and is further configured to control the operation of one or more components of system resources 118, such as first inrush circuit 104 and second inrush circuit 105.

Figure 2:
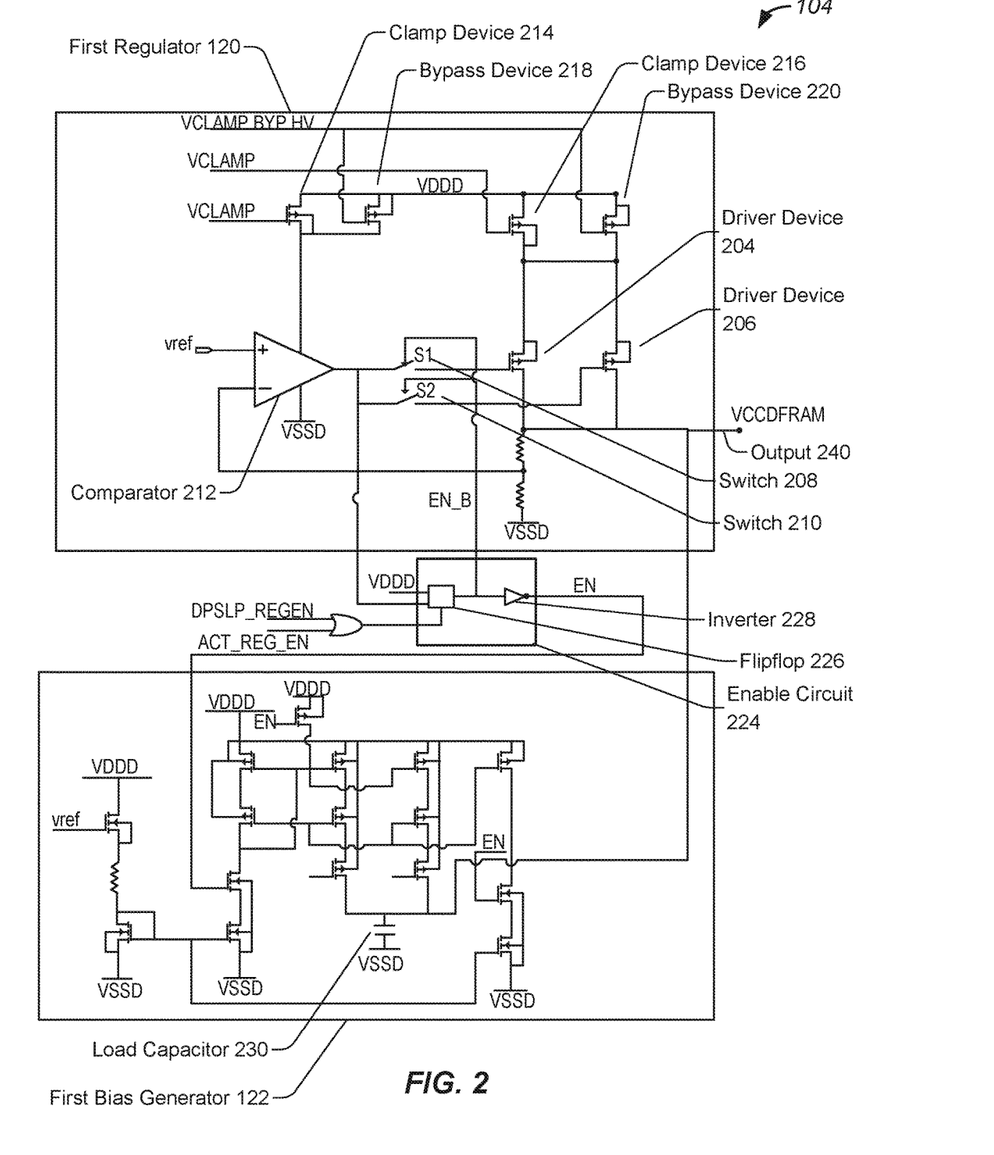
FIG. 2 illustrates an example of an inrush circuit, configured in accordance with some embodiments.

FIG. 2 illustrates an example of an inrush circuit, configured in accordance with some embodiments. As discussed above, an inrush circuit, such as first inrush circuit 104, may be configured to generate and provide a low inrush current to system components to preserve battery life and increase the efficiency of the operation of the device itself. As will be discussed in greater detail below, the implementation of such an inrush circuit provides a current to a memory device to facilitate power up and transition between operational modes while adhering to operational parameters, such as not exceeding a designated amount of current, and powering up/transitioning within a designated amount of time. Moreover, embodiments of inrush circuits disclosed herein may also provide benefits to the design of driver devices used to generate currents, as well as increased consistency of operational parameters, such as ramp up currents and times. Furthermore, in some embodiments, transitions between operational modes may be implemented automatically.

In various embodiments, first inrush circuit 104 includes regulator 202 which is configured to generate a current that may be provided to power a device, such as low energy integrated circuit 102. In various embodiments, regulator 202 may provide such a current during normal operation of low energy integrated circuit 102, and during an active state of low energy integrated circuit 102. Accordingly, first regulator 120 may include one or more driver devices, such as driver device 204 and driver device 206, which are configured to generate, when activated, the current provided to low energy integrated circuit 102 during an active state. As shown in FIG. 2, inputs of the driver devices may be coupled to switches, such as switch 208 and switch 210 which may be operated by a first enable signal described in greater detail below. In various embodiments, driver device 204 and driver device 206 may each be a transistor device whose characteristics, such as size and geometry, are configured based on a desired current generation characteristic.

Such current generation characteristics are determined, for example, based on input current requirements of coupled devices, such as a memory device. It will be appreciated that while FIG. 2 illustrates two driver devices, any suitable number of driver devices may be used. For example, if additional current generation is desired, additional driver devices, such as a third and fourth driver device, may be implemented.

First regulator 120 further includes comparator 212 which is configured to compare a divided voltage with a reference voltage, and provide an output to the driver devices via the switches, and also provide the output to enable circuit 224 described in greater detail below. Accordingly, when the divided voltage, which is dependent on the voltage across the load capacitor as well as the input at the VCCDFRAM terminal of low energy integrated circuit 102 which may be coupled to output terminal 240, exceeds a designated threshold which may be the reference voltage, comparator 212 may generate an output that is provided to the driver devices as well as enable circuit 224. In various embodiments, the output may be a digital signal that is either high or low. In one example, the output may be VDDD or 0V. In various embodiments, the voltage at output terminal 240 is a load voltage that characterizes a voltage across a load coupled to an output of first inrush circuit 104.

First regulator 120 may also include clamp devices and bypass devices such as clamp device 214 and clamp device 216, as well as bypass device 218 and bypass device 220. Such devices may be implemented to limit a supply voltage provided to comparator 212 as well as driver device 204 and driver device 206. For example, clamp device 214 and clamp device 216 may be configured to limit the supply voltage of comparator 212 and the supply voltage of driver device 204 and driver device 206 at a designated clamp voltage when a power supply voltage of system 100 VDDD is within a designated range, such as between 2.0V to 3.6V. When VDDD goes below a designated threshold, such as 2V, clamp device 214 and clamp device 216 are bypassed by bypass device 218 and bypass device 220. In this way, low voltage devices may be used for components of first regulator 120, such as comparator 212, and consistent performance characteristics may be ensured despite any variances in the voltage level of the power supply voltage of system 100 VDDD, which may be provided by system resources 118.

In some embodiments, first inrush circuit 104 further includes first bias generator 122 which is configured to generate a current to charge a load capacitor, such as load capacitor 230, coupled with an output terminal, such as output 240, which may also be coupled to a power terminal of the low energy memory device, and provide the initial current that may be utilized to transition between modes, and for example, to an active state, as will be discussed in greater detail below with reference to FIG. 4. More specifically, first bias generator 122 may include branches of transistor devices configured to generate a current applied to the load capacitor, and further configured to provide trimming capabilities applied to such current. Furthermore, as shown in FIG. 2, first bias generator 122 may be configured to receive a second enable signal from enable circuit 224, and such a second enable circuit may activate transistor devices within first bias generator 122 to generate the current that charges the load capacitor.

In various embodiments, first inrush circuit 104 also includes enable circuit 224 which is configured to receive on or more inputs that may identify an operational state of low energy integrated circuit 102, and is further configured to generate one or more outputs that facilitate the generation of a current provided to low energy integrated circuit 102. More specifically, enable circuit 224 may receive inputs identifying an operational state that low energy integrated circuit 102 is transitioning to. In one example, and as shown in FIG. 2, a first input may identify a deep sleep enable signal, and a second input may identify an active enable signal. It will be appreciated that the first input may identify other enable signals as well, such as a hibernate enable signal and a deep power down enable signal. As discussed above, such inputs are generated by processor 108. Based on such inputs, enable circuit 224 is configured to generate a first enable signal and a second enable signal that are provided to first regulator 120 and first bias generator 122, respectively, that facilitate the generation of an inrush current that implements the transition in operational state.

In some embodiments, enable circuit 224 is also configured to receive an output of comparator 212, and is configured to detect and identify transitions in the output of comparator 212. For example, enable circuit 224 may include flipflop 226 that is latched by an output of comparator 212, and an output of flipflop 226 may generate the first enable signal that is provided to first regulator 120. In some embodiments, the first enable signal may be provided to inverter 228 to generate a second enable signal that is provided to first bias generator 122. Flipflop 226 may also have an input coupled to an external supply voltage VDDD, and a reset input may be coupled to the previously described inputs that may be indicative of a desired operational mode transition.

Accordingly, when input signals identify a transition, they may both be low or 0, and set enable circuit 224 into a reset mode. As discussed above, processor 108 is configured to generate such input signals. For example, in a transition from a low energy mode to a high energy mode, flipflop 226 is reset and sets first enable signal at 0, and second enable signal at 1. When the first enable signal is 0, switch 208 and switch 210 are turned off. Moreover, the second enable signal is 1, and first bias generator 122 is enabled thus initiating the charging of load capacitor 230 coupled to the VCCDFRAM terminal of low energy integrated circuit 102. Once load capacitor 230 coupled to the VCCDFRAM terminal of low energy integrated circuit 102 has reached high enough voltage, comparator 212 changes outputs, and its output goes from low to high, thus making the output of flipflop 226, which is the first enable signal, go high or to 1, and the second enable signal go low or to 0. With the first enable signal high, and the second enable signal low, switch 208 and switch 210 are turned on and driver device 204 and driver device 206 are activated. Furthermore, first bias generator 122 is turned off, thus terminating the low inrush current mode.

It will be appreciated that various transitions between modes may be implemented as described above. For example, such transitions may include a transition from a low energy mode to a high energy mode that may be a transition from a deep sleep mode to an active mode. In another example, the transition may be from a hibernate mode to an active mode. In this way, the input signals received at enable circuit 224 are configured to identify the onset of such transitions, and enable circuit 224 is configured to generate enable signals to implement such transitions.

Moreover, while FIG. 2 describes aspects of first inrush circuit 104, such components may be configured to implement second inrush circuit 105 as well. Accordingly, second inrush circuit 105 may be implemented utilizing the various components described in FIG. 2.

Figure 3:
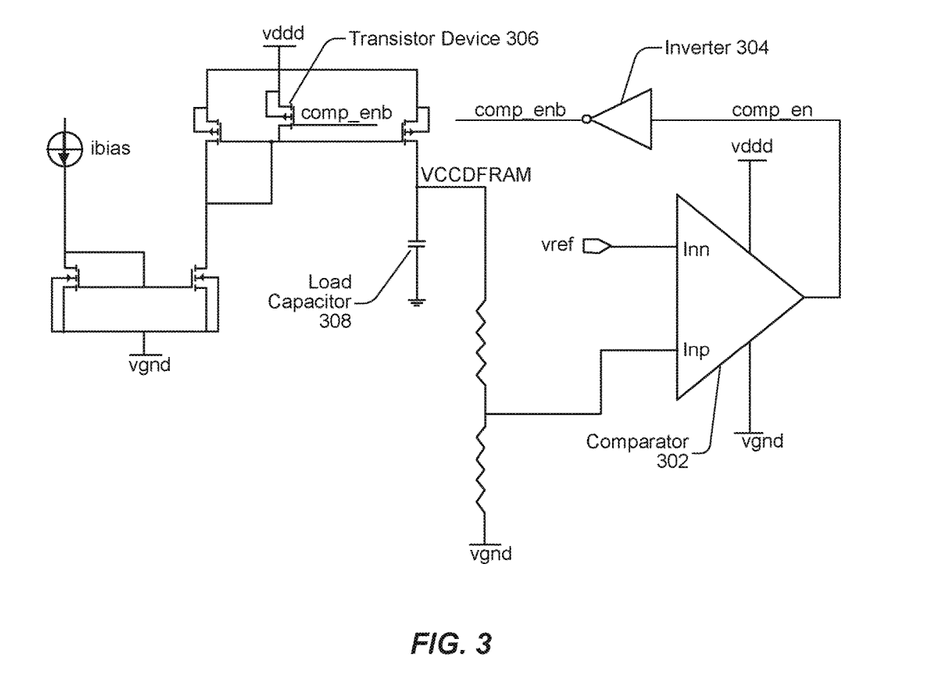
FIG. 3 illustrates another example of an inrush circuit, configured in accordance with some embodiments.

FIG. 3 illustrates another example of an inrush circuit, configured in accordance with some embodiments. As discussed above, an inrush circuit may be configured to generate and provide a low inrush current to system components to preserve battery life and increase the efficiency of the operation of the device itself.

As shown in FIG. 3, comparator 302 may have a positive input coupled to a voltage divider and a negative input coupled to a reference voltage. The output of comparator 302 may be used to generate a first enable signal. Moreover, an output of comparator 302 may be provided to inverter 304 to generate a second enable signal. The second enable signal may be provided to transistor device 306. Accordingly, when the voltage across load capacitor 308 and at the voltage divider is low, the output of comparator 302 will be low, and the second enable signal will be high. Accordingly, a current may be provided to charge load capacitor 308 coupled to the VCCDFRAM terminal of low energy integrated circuit 102. Once the voltage across load capacitor 308 and at the voltage divider reaches a designated threshold, the output of comparator 302 will go high, and the second enable signal will be low. Accordingly, the current source is shut off, and an external power supply, which may be a tile die regulator, may be enabled to provide current and power to the VCCDFRAM terminal of low energy integrated circuit 102 for an active mode of operation.

Figure 4:
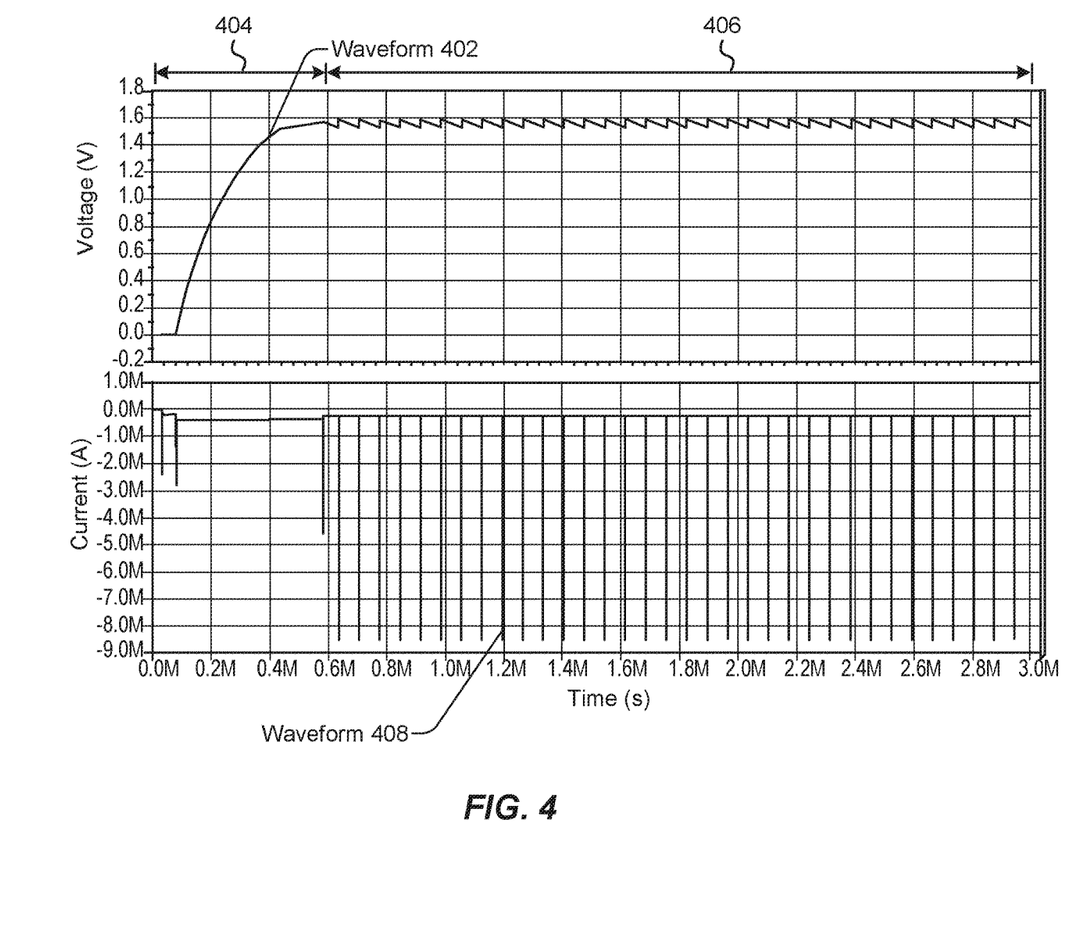
FIG. 4 illustrates a representation of a current during powerup, implemented in accordance with some embodiments.

FIG. 4 illustrates a representation of a current during powerup, implemented in accordance with some embodiments. Accordingly, the representation shown in FIG. 4 may characterize a current generated during a transition from an inactive mode, such as a deep sleep mode, to an active mode. As shown in FIG. 4, waveform 402 illustrates a gradual increase in voltage provided by first inrush circuit 104 during a powerup phase in which low energy integrated circuit 102 is transitioning from a low energy mode to a high energy mode. Accordingly, during first time period 404, first bias generator 122 is gradually charging a load capacitor, such as load capacitor 230, coupled to the VCCDFRAM terminal of low energy integrated circuit 102. Once charged, during second time period 406, an active mode commences, and first regulator 120 as well as its corresponding driver devices are used.

Moreover, waveform 408 illustrates an amplitude of the current during each respective time period. For example, during first time period 404, the amplitude of the current has few spikes and is relatively small. As discussed above, this is accomplished by utilization of first bias generator 122 discussed above. However, during an active mode of operation in which driver devices are used, as shown in second time period 406, current spikes are evident due to the use of the driver devices. In this way, current draw and battery usage associated with inactive modes of operation and transition between modes is reduced, and such transitions are implemented with greater consistency and efficiency.

Figure 5:
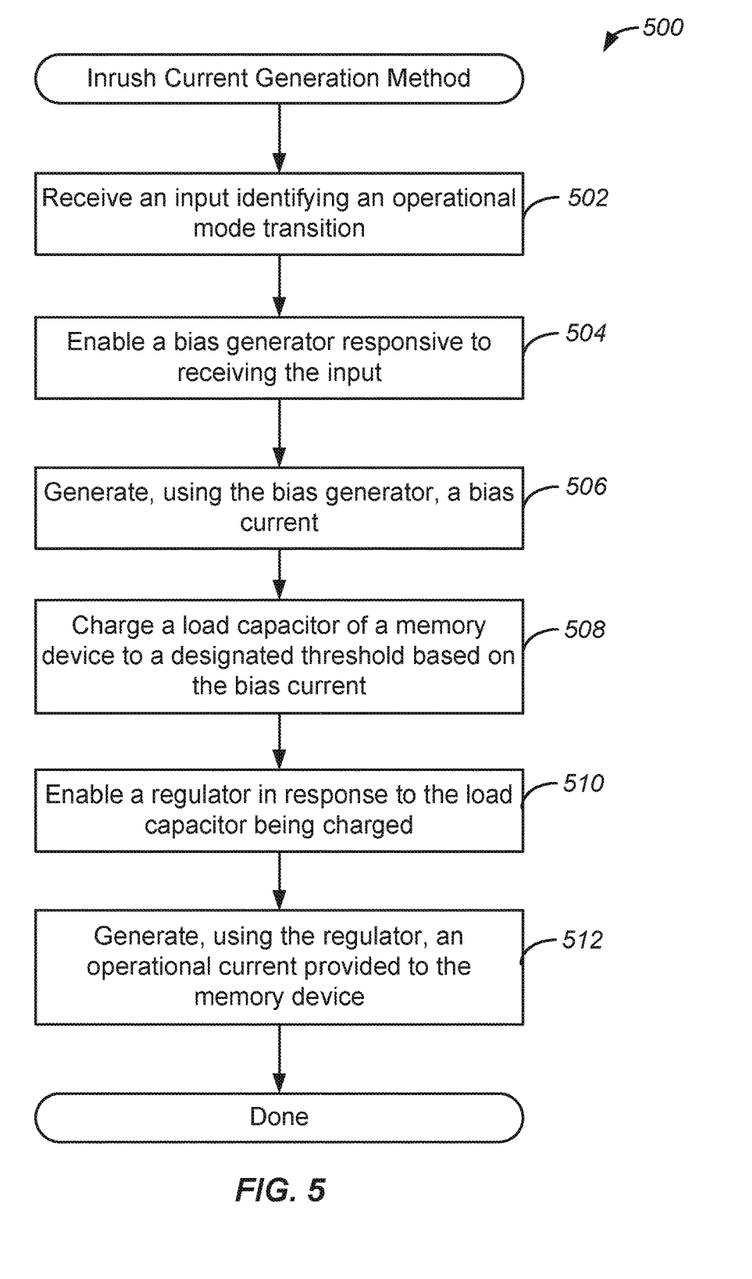
FIG. 5 illustrates a method for providing power to a low energy integrated circuit, implemented in accordance with some embodiments.

FIG. 5 illustrates a method for providing power to a low energy memory device, implemented in accordance with some embodiments. As discussed above, an inrush circuit may be implemented to generate and provide inrush currents utilized by low energy components and devices during transitions between operational modes. As will be discussed in greater detail below, various methods disclosed herein, such as method 500, may be implemented to facilitate such transitions in accordance with operational constraints such as current amplitudes and time windows.

Accordingly, method 500 may commence with operation 502 during which an input may be received. In various embodiments, the input identifies a mode transition to be implemented. For example, the input may be received at an inrush circuit from a system component, such as a processor, and may identify an operational mode to be transitioned to. In one example, the input may indicate that a transition is to be implemented from a deep sleep mode to an active mode.

Method 500 may proceed to operation 504 during which a bias generator may be enabled. As discussed above, an enable circuit may generate a first enable signal to disable a regulator, and also generate a second enable signal to enable the bias generator. Accordingly, the second enable signal may be provided to the bias generator to enable operation of the bias generator.

Method 500 may proceed to operation 506 during which a bias current may be generated by the bias generator. Accordingly, the bias generator may generate a bias current that is provided to a load capacitor and a VCCDFRAM terminal of the memory device. In this way, the bias current generated by the bias generator may be used to charge the load capacitor while the regulator is disabled.

Method 500 may proceed to operation 508 during which the load capacitor may be charged to a designated threshold voltage. Accordingly, the load capacitor may continue to be charged by the bias generator until the voltage across the load capacitor reaches a designated threshold voltage.

Method 500 may proceed to operation 510 during which a regulator may be enabled. Accordingly, as similarly discussed above, a component of the regulator, such as a comparator, may identify the load voltage reaching the threshold voltage, and may cause the enable circuit to modify the first and second enable signals. Accordingly, the enable circuit may disable the bias generator, and enable the regulator such that driver devices included in the regulator are able to provide current to the VCCDFRAM terminal of the memory device.

Accordingly, method 500 may proceed to operation 512 during which the regulator may provide current for active operation of the memory device. In this way, driver devices included in the regulator may be activated and used during active operation of the memory device to generate what may be referred to as an operational current, and the bias generator may be disabled during such active operation.

Although the foregoing concepts have been described in some detail for purposes of clarity of understanding, it will be apparent that certain changes and modifications may be practiced within the scope of the appended claims. It should be noted that there are many alternative ways of implementing the processes, systems, and devices. Accordingly, the present examples are to be considered as illustrative and not restrictive.

What is claimed is:

1. A device comprising:
   a regulator comprising at least one driver device configured to generate a first current associated with a load comprising a low energy integrated circuit;
   a bias generator configured to generate a second current to charge a load capacitor coupled with a power terminal of the low energy integrated circuit; and
   an enable circuit comprising at least a flipflop and an inverter configured to enable the bias generator and disable the regulator responsive to a load voltage being below a threshold voltage, and further configured to enable the regulator to generate the first current and disable the bias generator responsive to the load voltage being above the threshold voltage.

2. The device of claim 1, wherein the enable circuit is configured to generate a first enable signal and a second enable signal based on an operational mode of the low energy integrated circuit.

3. The device of claim 2, wherein the operational de is selected from a group of operational modes consisting of: hibernate, deep power down, deep sleep, and active.

4. The device of claim 2, wherein the enable circuit is configured to generate the first enable signal and second enable signal to implement a transition from a low energy mode to a high energy mode.

5. The device of claim 1, wherein the threshold voltage is identified based on a comparison of a representation of the load voltage, and a reference voltage.

6. The device of claim 1 further comprising:
one or more clamp devices configured to clamp a voltage received by the regulator and at least one driver device.

7. The device of claim 6 further comprising:
one or more bypass devices configured to bypass the one or more clamp devices.

8. The device of claim 1, wherein the low energy integrated circuit is a ferro electric random-access memory device.

9. A system comprising:
a processor;
a low energy integrated circuit;
a memory controller coupled to the processor and the low energy integrated circuit; and
an inrush circuit coupled to the low energy integrated circuit, the inrush circuit comprising:
a regulator comprising at least one driver device configured to generate a first current associated with a load comprising the low energy integrated circuit;
a bias generator configured to generate a second current to charge a load capacitor coupled with a power terminal of the low energy integrated circuit; and
an enable circuit configured to enable the bias generator and disable the regulator responsive to a load voltage being below a threshold voltage, and further configured to enable the regulator to generate the first current and disable the bias generator responsive to the load voltage being above the threshold voltage.

10. The system of claim 9, wherein the enable circuit is configured to generate a first enable signal and a second enable signal based on an operational mode of the low energy integrated circuit.

11. The system of claim 10, wherein the operational mode is selected from a group of operational modes consisting of: hibernate, deep power down, deep sleep, and active.

12. The system of claim 10, wherein the enable circuit is configured to generate the first enable signal and second enable signal to implement a transition from a low energy mode to a high energy mode.

13. The system of claim 9, wherein the threshold voltage is identified based on a comparison of a representation of the load voltage, and a reference voltage.

14. The system of claim 10 further comprising:
one or more clamp devices configured to clamp a voltage received by the regulator and at least one driver device.

15. The system of claim 14 further comprising:
one or more bypass devices configured to bypass the one or more clamp devices.

16. A method comprising:
receiving an input identifying a transition of an operational mode of a low energy integrated circuit from a first operational mode to a second operational mode;
enabling a bias generator, using an enable circuit comprising at least a flipflop and an inverter, in response to receiving the input, the bias generator generating a bias current provided to a load capacitor at a power terminal of the low energy integrated circuit;
charging the load capacitor based on the bias current; and
enabling a regulator, using the enable circuit, in response to the load capacitor being charged to a designated threshold, the enabling of the regulator generating; using at least one driver device, an operational current provided to the low energy integrated circuit.

17. The method of claim 16, wherein the enabling of the bias generator further comprises disabling the regulator, and wherein the enabling of the regulator further comprises disabling the bias generator.

18. The method of claim 17, wherein the first operational mode is a low energy mode, and wherein the second operational mode is a high energy mode.

19. The method of claim 16, wherein the operational mode is selected from a group of operational modes consisting of: hibernate, deep power down, deep sleep, and active.

* * * * *